United States Patent [19]
Giebel

[11] Patent Number: 4,597,064
[45] Date of Patent: Jun. 24, 1986

[54] ELECTRICALLY PROGRAMMABLE MEMORY MATRIX

[75] Inventor: Burkhard Giebel, Denzlingen, Fed. Rep. of Germany

[73] Assignee: ITT Industries, Inc., New York, N.Y.

[21] Appl. No.: 518,239

[22] Filed: Jul. 28, 1983

[30] Foreign Application Priority Data

Aug. 6, 1982 [EP] European Pat. Off. ......... 82107132.1

[51] Int. Cl.[4] .................................................. G11C 8/00
[52] U.S. Cl. ..................................... 365/230; 365/189; 365/185
[58] Field of Search ................ 365/185, 189, 230, 218

[56] References Cited

U.S. PATENT DOCUMENTS 4,434,478 2/1984 Cook et al. ........................... 365/185

Primary Examiner—Joseph A. Popek
Attorney, Agent, or Firm—James B. Raden; Donald J. Lenkszus

[57] ABSTRACT

An electrically programmable memory matrix comprises electrically programmable memory cells arranged in columns and rows, each consisting of a source-drain series arrangement of a memory transistor with a select transistor. The gate of the select transistor may be connected to one of row selecting lines of a row decoder, to which there are connected all gates of one row of the selected transistors of the memory cells of the same row. Control gates of groups of memory transistors (Ts) of one row may be connected to one common programming line, with these programming lines being connected by blocks via each time one group select transistor to one common block line which, via the source-drain line of a block select transistor whose gate is connected to one of a plurality of outputs of a block decoder is connected to one source of block signals. Re-programmability of a fixed number of memory cells only upon application of a further input signal, apart from a function signal, is accomplished by subdividing at least one of the two decoders into a first decoder part to the function signal input of which the programming signal is applied directly, and into a second decoder part whose function signal input is connected to the output of a gate circuit having two inputs. Th output signal of the gate circuit is only then at the value corresponding to the function "programming" when the first input is also at the value corresponding to the function "programming", and when the second input is at that particular value which permits a programming of the second decoder part.

5 Claims, 4 Drawing Figures

ELECTRICALLY PROGRAMMABLE MEMORY MATRIX

BACKGROUND OF THE INVENTION

The present invention relates to memory matrices in general and more particularly to electronically programmable memory matrices.

From the technical journal "Electronics" of Feb. 28, 1980, pp. 113 through 117, there is known an electrically programmable memory matrix comprising programmable memory cells arranged in m columns and n rows. Each of the memory cells contains a source-drain series arrangement of a memory transistor with a select transistor. In the conventional memory matrix, there is used a memory transistor comprising an electrically floating electrode (floating gate) which, by tunnelling electrons through a thin oxide layer between the substrate and the electrically floating electrode, can be recharged as a storage medium.

From the "1980 IEEE International Solid-State Circuits Conference, Digest of Technical Papers", pp. 152 and 153 there is known a memory matrix comprising the aforementioned types of memory cells which are arranged in memory groups of b memory cells each. The memory groups, in turn, are organized in w blocks of b columns and n rows. The gates of the w . b=m select transistors of each row are connected, via a column row selecting line, to each time one of n outputs of a row decoder. The control gates of the b memory transistors of each group, however, are connected to a common programming line and, via the source-drain line of a group select transistor, are connected in blocks to a common block line. The gate of the group select transistor is connected to the corresponding row select line. Accordingly, a blockwise selection of the groups of each block becomes possible.

Moreover, in the conventional type of electrically erasable memory matrix, the memory cells are connected by columns to each time one throughgoing first and second bit line, and the block line is connected to one block signal source per block, via the source-drain line of a block select transistor whose gate is connected to one of w outputs of a block decoder. Moreover, the outputs of the block decoder are connected to the gates of b column select transistors whose source-drain lines, in turn, each time connect one of the second bit lines of each block to one of the data lines.

In the conventional memory matrix of this type the first bit lines are capable of being connected to a ground potential either low-ohmically according to the chosen function "erasing" or high-ohmically according to the function "writing". On the other hand, the second bit lines are capable of being connected to the ground potential during "erasing", or to a potential sufficiently high in relation to the ground potential during the "writing" operation, or are capable of being connected to the read potential during the "reading" operation. For the "erasing" and the "writing" operation, the gates of the select transistors are capable of being connected to the programming potential.

The invention relates to a memory matrix in which there is provided at least one of the aforementioned decoders (block decoder or row decoder). Such a memory matrix is suitable for use with equipment in which, according to the intended use, a portion of the memory cells is available for reprogramming by the user while another portion, may be used for storing company-owned balancing or other proprietary data. Yet, in the conventional memory matrix and associated circuitry of the above described type, the user is able to access even the latter portion of the memory matrix for reprogramming the same, which is quite disadvantageous since such reprogramming, whether intentional or inadvertent, could wreak havoc in the operation of the equipment.

SUMMARY OF THE INVENTION

Accordingly, it is a general object of the present invention to avoid the disadvantages of the prior art.

More particularly, it is an object of the present invention to avoid the possibility that certain data contained in the memory matrix and intended to remain intact could be modified by the user of the equipment in which the memory matrix is being used.

Still another object of the present invention is so to construct the electrically programmable memory matrix of the type here under consideration as to be able to protect data stored in a certain part of the memory matrix from interference by the user, while still permitting authorized personnel to program this part of the memory matrix when needed.

A concomitant object of the present invention is so to design the electrically programmable memory matrix arrangement as to be simple in construction, inexpensive to manufacture, easy to use, and reliable in operation nevertheless.

In pursuance of these objects and others which will become apparent hereafter, one feature of the present invention resides in an electrically programmable memory matrix arrangement, comprising a memory matrix including a plurality of electrically programmable memory cells, including a first and a second plurality of the memory cells that are respectively to be accessible and inaccessible to the user of the arrangement for programming; means for selectively applying a plurality of potentials, including at least one programming potential, to the memory cells in accordance with their respective addresses, including at least one address decoder which includes separate first and second parts having respective first and second outputs operative for controlling the application of at least the programming potential to the memory cells of the first plurality, and of the second plurality, respectively, and each having an input operative for supplying to the respective decoder part a programming signal that enables the respective decoder part to control the application of the programming potential to the memory cells of the respective plurality; means for supplying the programming signal directly to the input of the first decoder part during the programming operation; and means for rendering the second decoder part inaccessible to the user but accessible to authorized personnel for programming purposes, including a gate circuit having an output connected to the input of the second decoder part, a first input having the programming signal applied thereto, and a second input capable of being supplied with a control signal at the option of the authorized personnel, this gate circuit being operative for issuing the programming signal at the output thereof only when both the programming and control signals appear simultaneously at the first and second inputs thereof during the programming operation.

The invention is thus based on the idea of modifying at least one of the two decoders used to address the respective memory calls in such a way by providing an additional circuit, that in the lead extending to the programming line of the one or more memory cells to be protected there is arranged at least one transistor, viz. at least the associated group selection transistor or the associated block selection transistor, and that in the lead extending to the injector of the memory cell to be protected or to the injectors of the memory cells to be protected there is likewise arranged at least one transistor, viz. at least the associated select transistor or the associated column select transistor, with the gate voltage of these transistors being restricted in such a way (e.g., to be smaller than 8 V) that a high potential that would be required for reprogramming, can appear neither on the programming line nor at the injector associated with the memory call to be protected.

BRIEF DESCRIPTION OF THE DRAWING

In the following the invention is explained with reference to the accompanying drawing, in which.

DETAILED DESCRIPTION OF THE PREFERRED EMBODIMENTS

Figure 1:
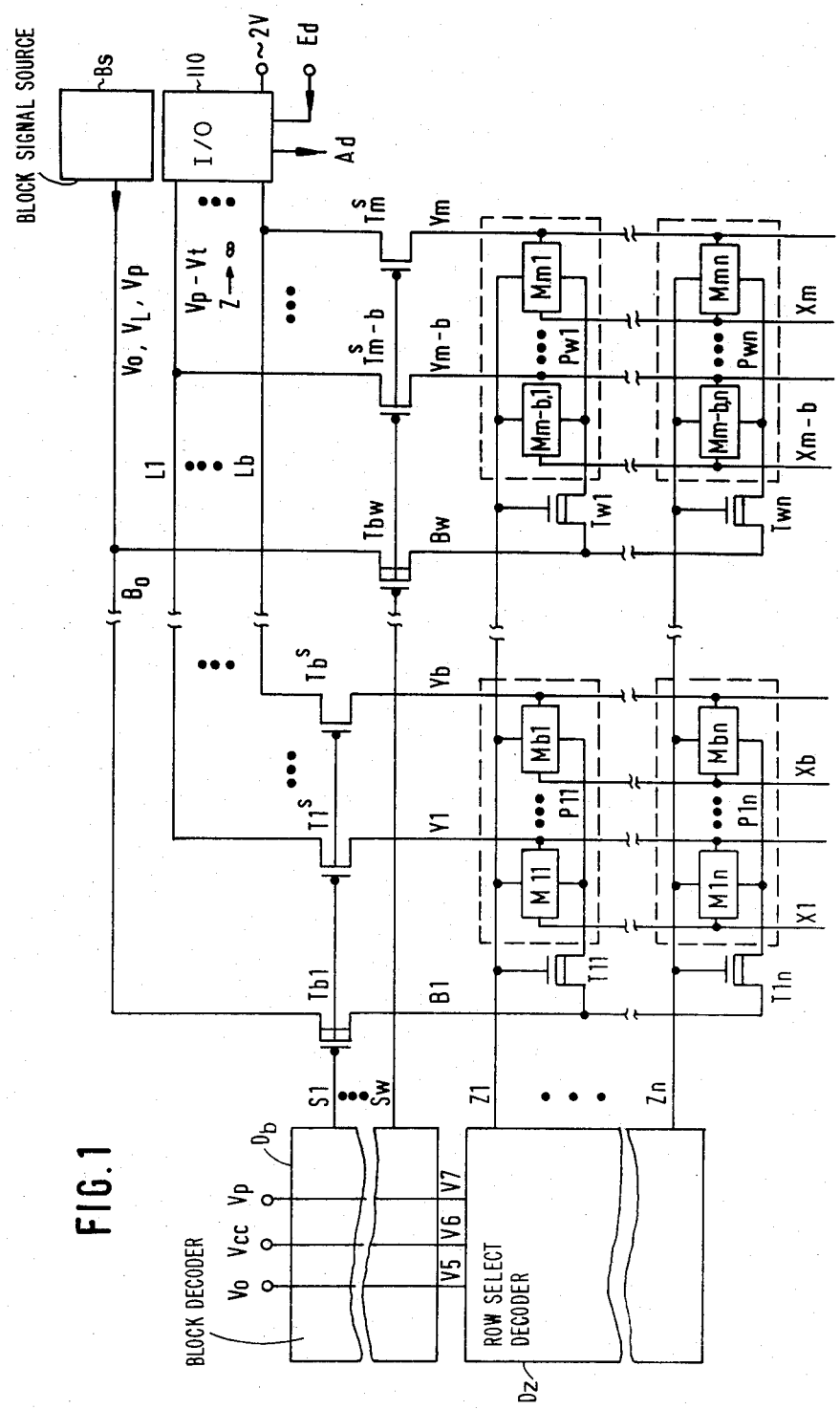
FIG. 1 is a block diagram of an electrically programmable memory matrix arrangement in which the present invention may be used.
Figure 2:
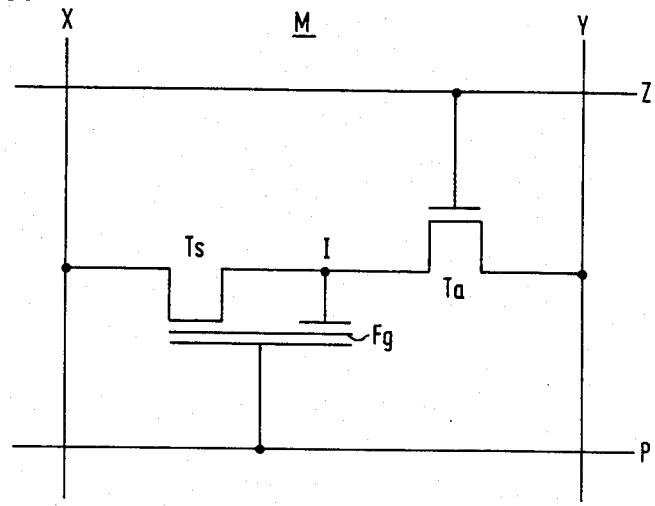
FIG. 2 is a basic circuit diagram of a memory cell suitable for being used with the memory matrix as shown in FIG. 1.

Referring now to the drawing detail, and first to FIG. 1, thereof, it may be seen that it depicts an electrically programmable memory matrix arrangement which contains m.n memory cells M11 through Mmn. Each of the memory cells, M11 to Mmn can be constructed and connected in the same manner as the memory cell M shown in FIG. 2. In this memory cell M, comprising an electrically floating gate electrode Fg of the type as described in detail in the aforementioned publication "Electronics" of Feb. 28, 1980, there is provided a tunnel injector I which is effective in both directions in relation to the electrically floating electrode Fg and which is connected on the one hand, via a source-drain line of a select transistor Ta, to a second bit line X. The control gate of the memory transistor Tx is connected to a programming line P, while the gate of the select transistor Ta is connected to a row select line Z.

Moreover, in the electrically erasable memory matrix as shown in FIG. 1, the memory cells M11 through Mmn are arranged in w blocks of b columns each, so that storage groups result each including b electrically reprogrammable memory cells. The control gates of the memory transistors Ts of each group are all connected to one common programming line from among the programming lines P11 through Pwn. Each of these programming lines, P11 to Pwn is connected via a source-drain line of one of group select transistors T11 through Twn, to one of w block lines B1 to Bw to which, optionally, and via the source-drain line of one of the w block select transistors Tb1 through Tbw, there is applied either a ground potential Vo, a read potential $V_L$ or a programming potential Vp. The gates of the block select transistors Tb1 through Tbw and the gates of the respective associated column select transistors T1s through Tms are connected to each time one of the w outputs S1 to Sw of a block decoder Db. On the other hand, the row select lines Z1 to Zn are connected to respective outputs of a row select decoder Dz. The bit lines, for example, Y1 through Yb, are connected each via a source-drain line of one of the b column select transistors, T1s through Tms and via one of the data lines L1 through Lb, to one of b outputs of a data input/output circuit 110 via which the data can be fed in or read out in the form of words.

In connection with the memory cell under consideration employing a memory transistor having an electrically floating electrode, the term "erase" refers to the operation by which charges from the conductivity type of the diffusion zones, reach the storage medium designed as an electrode having a floating potential. In the case of an MNOS memory transistor, this storage medium is given by the interface between the oxide layer and the nitride layer from which the gate insulating layer is made. Accordingly, in the case of an n-channel type memory transistor, and during the "erase" operation, electrons are injected into the storage medium and, during the "write" operation are removed therefrom.

The address of the memory cell M11 to Mmn which is intended to be reprogrammed, is fed digitally into the block decoder Db, into the row decoder Dz and into the data circuit 110. By the digital address signals as fed into the decoders, Db and Dz there is determined the memory cell M11 to Mmn to be reprogrammed, which is arranged at the intersecting region of those of the first bit lines X1 to Xm of the second bit lines Y1 to Ym of the programming lines P11 to Pwn and the row selecting lines Z1 to Zn that are selected by the decoders Db and Dz in dependence on the address. Cells M11 to Mmn which are not selected, are not reprogrammed.

Since, for understanding the invention, merely the functions "erasing selected", "erasing not selected", "writing selected" and "writing not selected" are of interest, these are stated in the following function table together with the potentials for the cell/select lines. If, by M(1) there is understood a selected memory cell and, by M(0) there is understood a non-selected memory cell, then in the memory matrix as shown in FIG. 1, the potentials as stated in the following function table are applied to the aforementioned lines:

|   | Erasing | | Writing | |
|---|---|---|---|---|
|   | M(1) | M(0) |   |   |
| Z | Vp | Vo | Vp | M(0) |
| S | Vp | Vo | Vp | Vo |
| P | Vp | /Vtd/or Vo | Vp | Vo |
| X | Vo | Vo | Vo (high-omic) | Vo |
| Y | Vo | Vo | Vp-Vte | Vo (high-ohmic) |

In this table, Vte indicates the threshold voltage of an enhancement type field-effect transistor, which is not shown in FIG. 1, but which is arranged in the Y line, and Vtd indicates the threshold voltage of the group select transistors T11 through Twn.

It can be seen from the foregoing function table that, for example, when erasing the memory cell M11, the positive programming potential Vp is applied to the control gate via transistors Tb1 and T11 strongly switched on, while the second bit line Y1 is connected to the reference potential Vo or ground respectively. Therefore, electrons are injected from the injector I into the floating gate Fg. During the writing operation, however, the positive potential Vp-Vte, which lies in the proximity of the programming potential Vp, and via the second bit line Y1 which is blocked against ground by means of a transistory lying in its course, is applied via the select transistor Ta which is strongly switched on by the programming voltage Vp, to the injector I, so that now electrons are injected from the floating gate into the injector.

The invention now provides for the possibility of blocking the reprogramming of a certain portion of the memory cells, M11 to Mmn in that the potentials on the lines via which a potential necessary for reprogramming the respective ones of the memory cells could be applied to the respective control gates, is restricted, as will be explained hereinafter.

Figure 3:
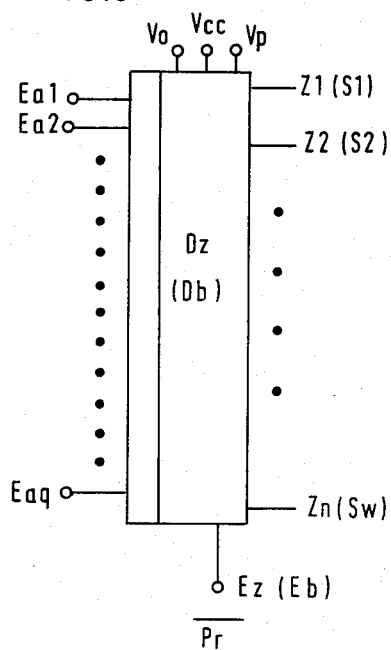
FIG. 3 is a block-type representation of a row decoder or of a block decoder as used in the arrangement of FIG. 1.

The row decoder Dz as shown in the block diagram of FIG. 1 which is designed in the conventional way, includes, as indicated in FIG. 3, address inputs Ea1 through Eaq via which, in the form of a digital word, the address of the selected memory cell or of the selected memory cells M(1) is fed in. Via function signal inputs, of which there is merely shown a programming signal input Ez, function signals "writing", "reading" . . . are optionally fed in. The row decoder Dz is finally provided with three voltage supply terminals to which the voltages or potentials necessary for operating the memory matrix are applied. These are the ground potential Vo, which, as a rule, corresponds to the ground potential, as well as the potential of the supply voltage Vcc and the potential Vp of the programming voltage source which, during the "writing" as well during the "erase" operation, is applied to the row select line Z1 to Zn of the memory cells M11 to Mmn to be programmed. Accordingly, when logic "zero" is applied to the function signal input Ez for effecting the "programming", then the programming potential Vp will appear on the selected row select line Z1 to Zn; otherwise, only Vcc will appear thereon.

The block decoder Db whose outputs S1 through Sw select the gates of the block select transistors Tb1 through Tbw associated with the outputs, as well as also, by blocks, the gates of the b column select transistors T1$^s$ through Tm$^s$, is designed in the same way as the block decoder Db, as is illustrated by the symbols in parentheses shown in FIG. 3.

Figure 4:
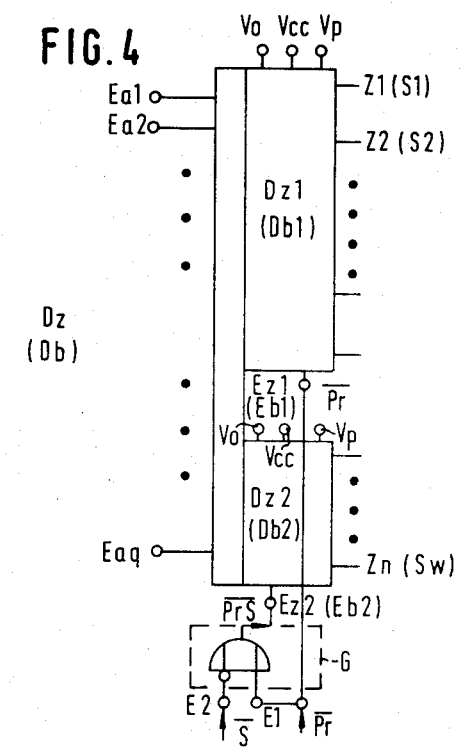
FIG. 4 is a block-type representation of a row decoder or of a block decoder of the electrically programmable memory matrix according to the invention.

In the block diagram of FIG. 4, the row decoder Dz as employed with the electrically programmable memory matrix, according to the invention, is an equivalent of the row decoder of conventional design as shown in FIG. 3. The same applies to the block decoder Db as is indicated by the symbols shown in parentheses. However, in contradistinction to the conventional row decoder Dz or block decoder $D_b$ of FIG. 3, the row decoder Dz or the block decoder Db of FIG. 4, as used with the electrically programmable memory matrix according to the invention is divided into a first decoder part Dz1 (Db1) and a second decoder part Dz2 (Db2). While the function signal $\overline{PR}$ is applied directly to the functional signal input Ez1 (Eb1) of the first decoder part Dz1 (Db1), the output of a gate circuit Gt which comprises two inputs E1 and E2, is connected to the function signal input Eb2 (Ez2) of the second decoder part Dz2 (Db2). According to the invention, this gate circuit Gt is designed in such a way that its output signal is at the value corresponding to the function "programming" only when the first input E1 corresponding to the function "programming" as well as the second input E2 are at that particular value which permits a programming of that particular memory matrix portion which is controlled (selected) by the second decoder part Dz2 (Db2).

According to the currently preferred construction as shown in FIG. 4, the gate circuit is an OR gate Gt whose first input E1 is connected to the function signal input Ez1 (Eb1) of the first decoder part Dz1 and whose second input E2 inverts the input signal $\overline{S}$ as applied thereto. In this way it is accomplished that upon connecting the second input E2 to the reference potential or to ground Vo, a selected row of the second decoder part Dz2 (Db2) is only reached by a potential Vcc, thus making a programming within the protected matrix portion impossible.

Such a gate circuit as shown in FIG. 4, is particularly advantageous when manufacturing equipment units employing an electrically erasable memory matrix, in which it is desired to store balancing data in the matrix portion that is controlled by the second decoder part Dz2 (Db2). Blocking of the second decoder part Dz2 (Db2) can be effected in a simple way by connecting the second input E2 to ground which, for example, can be done by means of a switch which is not easily accessible, or else by way of simple soldering to a ground terminal. As a rule, it is completely sufficient to design either the row decoder Dz or the block decoder Db in accordance with the invention, and to divide it in two parts with associated circuitry in order thus to block subsequent programming following an initial programming operation which might take place, for example, for balancing a television receiver. It is actually within the scope of the invention, however, so to divide and design both of the decoders D2 and Db. The invention is applicable to memory matrices employing any conceivable number of rows n, any number columns m, and naturally also to memory matrices whose memory cells M11 to Mmn have not been combined in blocks, and also to memory matrices comprising only one row or only one column.

While I have described above the principles of my invention in connection with specific apparatus, it is to be clearly understood that this description is made only by way of example and not as a limitation to the scope of my invention as set forth in the objects thereof and in the accompanying claims.

I claim:

1. An electrically programmable memory matrix arrangement, comprising:

a memory matrix comprising a plurality of electrically programmable memory cells, including a first and a second plurality of said memory cells that are respectively to be accessible and inaccessible to the user of the arrangement for programming;

means for selectively applying a plurality of potentials, including at least one programming potential, to said memory cells in accordance with their respective addresses, including at least one address decoder which includes separate first and second parts having respective first and second outputs operative for controlling the application of at least said programming potential to said memory cells of said first plurality, and of said second plurality, respectively, and including an input operative for supplying to the respective decoder part a programming signal that enables said decoder part to control the application of said programming potential to said memory cells of the respective plurality;

means for supplying said programming signal directly to said input of said first decoder part during a programming operation; and means for rendering said second decoder part inaccessible to the user, but accessible to authorized personnel for programming purposes, including a gate circuit having an output connected to said input of said second decoder part, a first input having said programming signal applied thereto, and a second input capable of being supplied with a control signal at the option of the authorized personnel, said gate circuit being operative for issuing said programming signal at said output thereof only when both said programming and control signals appear simultaneously at said first and second inputs thereof during the programming operation.

2. The electrically programmable memory matrix arrangement in accordance with claim 1, wherein:

said memory cells are arranged in respective columns and rows, are programmable in accordance with one of the selectable programming functions "writing" and "erasing", and are electrically readable in accordance with the function "reading", and each of which includes a source-drain series of a select transistor having a gate with a memory transistor having a control gate; and wherein said applying means includes:

a programming line connected to the respective control gate, a plurality of first bit lines which, in accordance with the selected function "erasing", can be applied in a low-ohmic manner or during the function "writing", can be applied in a high-ohmic manner to a ground potential, a plurality of second bit lines, which, during the "erasing" operation are capable of being applied to the ground potential, during the "writing" operation to a potential sufficiently high in relation to the ground potential and, during the "reading" operation, to a reading potential, each of said series being connected in a columnwise manner between the respective ones of said first and second bit lines, and means for connecting the gates of the select transistor for both the "erasing" and the "writing" operations to the programming potential, including a plurality of row selecting lines.

3. The electrical programmable memory matrix arrangement in accordance with claim 2, wherein: said row selecting lines are connected to said outputs of said decoder that acts as a row decoder.

4. The electrically programmable memory matrix arrangement in accordance with claim 2, wherein: said applying means includes a plurality of additional programming lines in addition to said programming line, said programming lines being commonly connected to the control gates of the memory transistors of rowwise groups of the memory cells, respective group select transistors having respective gates and source-drain lines connected between the respective programming and block lines and respective block signal transistors having respective gates connected to respective outputs in said decoder for the latter to serve as a block decoder, and respective source-drain lines operative for applying either the ground potential or the reading potential or the programming potential to the respective block lines, the individual outputs of the block decoder also being connected to the gates of those of the column select transistors via those source-drain lines the second bit lines of the respective group are connected to one of the selected potentials.

5. The electrically programmable memory matrix arrangement in accordance with claim 1, wherein: said gate circuit includes an OR gate whose first input is connected to said input of said first decoder part and whose second input inverts the confined signal applied thereto, so that, when the second input is connected to ground or to the reference potential, programming of the second decoder part is avoided.

* * * * *